US006977435B2

(12) United States Patent (10) Patent No.: US 6,977,435 B2
Kim et al. (45) Date of Patent: Dec. 20, 2005

(54) THICK METAL LAYER INTEGRATED PROCESS FLOW TO IMPROVE POWER DELIVERY AND MECHANICAL BUFFERING

(75) Inventors: Sarah E. Kim, Portland, OR (US); Bob Martell, Portland, OR (US); Dave Ayers, Fremont, CA (US); R. Scott List, Beaverton, OR (US); Peter Moon, Portland, OR (US); Steven Towle, deceased, late of Phoenix, AZ (US); by Anna M. George, legal representative, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/659,044

(22) Filed: Sep. 9, 2003

(65) Prior Publication Data

US 2005/0051894 A1 Mar. 10, 2005

(51) Int. Cl.[7] .............................................. H01L 29/40
(52) U.S. Cl. ....................... 257/734; 257/778; 257/758
(58) Field of Search ................................. 257/734, 690, 257/700, 737, 738, 778, 701, 691–692, 758–760, 257/773, E23.021, E23.069

(56) References Cited

U.S. PATENT DOCUMENTS

| 5,892,273 | A | * | 4/1999 | Iwasaki et al. ............. 257/690 |
| 5,950,102 | A | * | 9/1999 | Lee ............................. 438/619 |
| 6,117,299 | A | * | 9/2000 | Rinne et al. ................ 205/125 |
| 6,140,155 | A | * | 10/2000 | Mihara et al. .............. 438/124 |
| 6,222,279 | B1 | * | 4/2001 | Mis et al. .................... 257/779 |
| 6,230,400 | B1 | * | 5/2001 | Tzanavaras et al. .......... 29/840 |
| 6,350,668 | B1 | * | 2/2002 | Chakravorty ............... 438/612 |
| 6,518,675 | B2 | * | 2/2003 | Kim et al. ................... 257/773 |
| 6,563,202 | B1 | * | 5/2003 | Ohsawa et al. ............. 257/673 |
| 6,627,994 | B2 | * | 9/2003 | Hashimoto .................. 257/739 |
| 6,673,698 | B1 | * | 1/2004 | Lin et al. .................... 438/459 |
| 6,690,092 | B2 | * | 2/2004 | Umemura .................... 257/758 |
| 6,713,381 | B2 | * | 3/2004 | Barr et al. ................... 438/622 |
| 6,798,073 | B2 | * | 9/2004 | Lin et al. .................... 257/778 |
| 6,847,118 | B2 | * | 1/2005 | Milewski et al. ............ 257/738 |
| 6,868,604 | B2 | * | 3/2005 | Kresge et al. ................ 29/852 |
| 2002/0020898 | A1 | * | 2/2002 | Vu et al. ..................... 257/676 |
| 2003/0186486 | A1 | * | 10/2003 | Swan et al. ................. 438/125 |
| 2003/0218246 | A1 | * | 11/2003 | Abe et al. ................... 257/734 |
| 2004/0227251 | A1 | * | 11/2004 | Yamaguchi .................. 257/777 |

OTHER PUBLICATIONS

E. Beyne, J. Poormans; "Enabling Technologies for Distributed and Autonomous Electronic Systems, EDAS"; imec 2002 presentation.

* cited by examiner

Primary Examiner—Long Pham
Assistant Examiner—Thao X. Le
(74) Attorney, Agent, or Firm—Fish & Richardson P.C.

(57) ABSTRACT

A process flow to make an interconnect structure with one or more thick metal layers under Controlled Collapse Chip Connection (C4) bumps at a die or wafer level. The interconnect structure may be used in a backend interconnect of a microprocessor. The one or more integrated thick metal layers may improve power delivery and reduce mechanical stress to a die at a die/package interface.

28 Claims, 16 Drawing Sheets

HIGH CURRENT DEMAND DRIVER

| | FLOW 3 |
|---|---|
| | 1. CU DIFFUSION BARRIER |
| | 2. USE PHOTO-DEFINABLE ILD |
| 900 | PASSIVATION DEP (NITRIDE) |
| 902 | POLYIMIDE PATTERN |
| 904 | DEVELOP POLYIMIDE |
| 906 | BLM DEP |
| 908 | PR COATING |
| 910 | PR (THICK METAL LAYER #1) PATTERN |
| 912 | CU PLATING |
| 914 | RESIST STRIP |
| 916 | BLM ETCH/ASH |
| 1100 | EL DIFFUSION BARRIER PLATING |
| 918B | DEPOSIT DIELECTRIC (SELF-PLANARIZING POLYMER) |
| 920 | PHOTO-PATTERN VIAS |
| 922 | DEVELOP DIELECTRIC |
| 924 | BLM DEP |
| 926 | PR COATING |
| 928 | PR (THICK METAL LAYER #2) PATTERN |
| 930 | CU PLATING |
| 932 | RESIST STRIP |
| 934 | BLM ETCH/ASH |
| 1102 | EL DIFFUSION BARRIER PLATING |
| 936 | DEPOSIT DIELECTRIC (PHOTO-DEFINABLE POLYMER) |
| 938 | PHOTO-PATTERN VIAS |
| 940 | DEVELOP DIELECTRIC |
| 942 | BLM DEP |
| 944 | PR COATING |
| 946 | BUMP PATTERN |
| 948 | BUMP PLATING |
| 950 | RESIST STRIP |
| 952 | BLM ETCH/ASH |

FIG. 11A

| | FLOW 4 |
|---|---|
| | 1. CU DIFFUSION BARRIER |
| | 2. USE SELF-PLANARIZING ILD |
| 900 | PASSIVATION DEP (NITRIDE) |
| 902 | POLYIMIDE PATTERN |
| 904 | DEVELOP POLYIMIDE |
| 906 | BLM DEP |
| 908 | PR COATING |
| 910 | PR (THICK METAL LAYER #1) PATTERN |
| 912 | CU PLATING |
| 914 | RESIST STRIP |
| 916 | BLM ETCH/ASH |
| 1100 | EL DIFFUSION BARRIER PLATING |
| 918B | DEPOSIT DIELECTRIC (SELF-PLANARIZING POLYMER) |
| 954 | PR COATING |
| 956 | PATTERN VIAS |
| 958 | ETCH DIELECTRIC (DRY) |
| 960 | PR STRIP |
| 924 | BLM STRIP |
| 926 | PR COATING |
| 928 | PR (THICK METAL LAYER #2) PATTERN |
| 930 | CU PLATING |
| 932 | RESIST STRIP |
| 934 | BLM ETCH/ASH |
| 1102 | EL DIFFUSION BARRIER PLATING |
| 962 | DEPOSIT DIELECTRIC (SELF-PLANARIZING POLYMER) |
| 964 | PR COATING |
| 966 | PATTERN VIAS |
| 968 | ETCH DIELECTRIC (DRY) |
| 970 | PR STRIP |
| 942 | BLM DEP |
| 944 | PR COATING |
| 946 | BUMP PATTERN |
| 948 | BUMP PLATING |
| 950 | RESIST STRIP |
| 952 | BLM ETCH/ASH |

FIG. 11B

| | SIMULATION PARAMETERS | | RESULTS | |
|---|---|---|---|---|
| ADDITION THICK METAL LAYERS | METAL WIDTH | VIA RESISTANCE (MΩ) | IMAX (MA) | IR DROP (MV) |
| DEFAULT (PRESENT STATE OF ART) | | | 680 | 29 |
| TWO 45 μM THICK METAL LAYERS | 70 μM FOR METAL LAYER #2 100 μM FOR METAL LAYER #1 | 0.7 | 430 (36% IMAX IMPROVEMENT) | 30 |
| TWO 15 μM THICK METAL LAYERS | 70 μM FOR METAL LAYER #2 100 μM FOR METAL LAYER #1 | 0.7 | 530 (22% IMAX IMPROVEMENT) | 30 |
| TWO 45 μM THICK METAL LAYERS | 70 μM FOR METAL LAYER #2 100 μM FOR METAL LAYER #1 | 70 | 370 (46% IMAX IMPROVEMENT) | 49 |
| TWO 15 μM THICK METAL LAYERS | 70 μM FOR METAL LAYER #2 100 μM FOR METAL LAYER #1 | 70 | 380 (44% IMAX IMPROVEMENT) | 51 |

FIG. 14

THICK METAL LAYER INTEGRATED PROCESS FLOW TO IMPROVE POWER DELIVERY AND MECHANICAL BUFFERING

BACKGROUND

Each generation of complementary metal oxide semiconductor (CMOS) circuits usable in a microprocessor may have more transistors operating at lower voltages and higher frequencies. Since the resistance of transistors in each new generation may decrease more than voltage, and transistors may leak more current, CMOS circuits may demand more current. Higher current may be needed to pass from a substrate through a solder bump and a Controlled Collapse Chip Connection (C4) bump to a die. Each C4 bump may only be able to handle a limited amount of current due to electron migration failure. C4 bumps are known in the semiconductor industry as connections which provide current between a die and a substrate.

DESCRIPTION OF DRAWINGS

FIG. 11A shows an example of a process flow to make the interconnect structure of FIG. 10.

FIG. 11B shows an alternative process flow to make the interconnect structure of FIG. 10.

FIG. 14 is a table of simulation parameters and simulation results for the interconnect structure of FIG. 8A compared to current and voltage values for the standard interconnect structure of FIG. 1B.

DETAILED DESCRIPTION

Figure 1A:
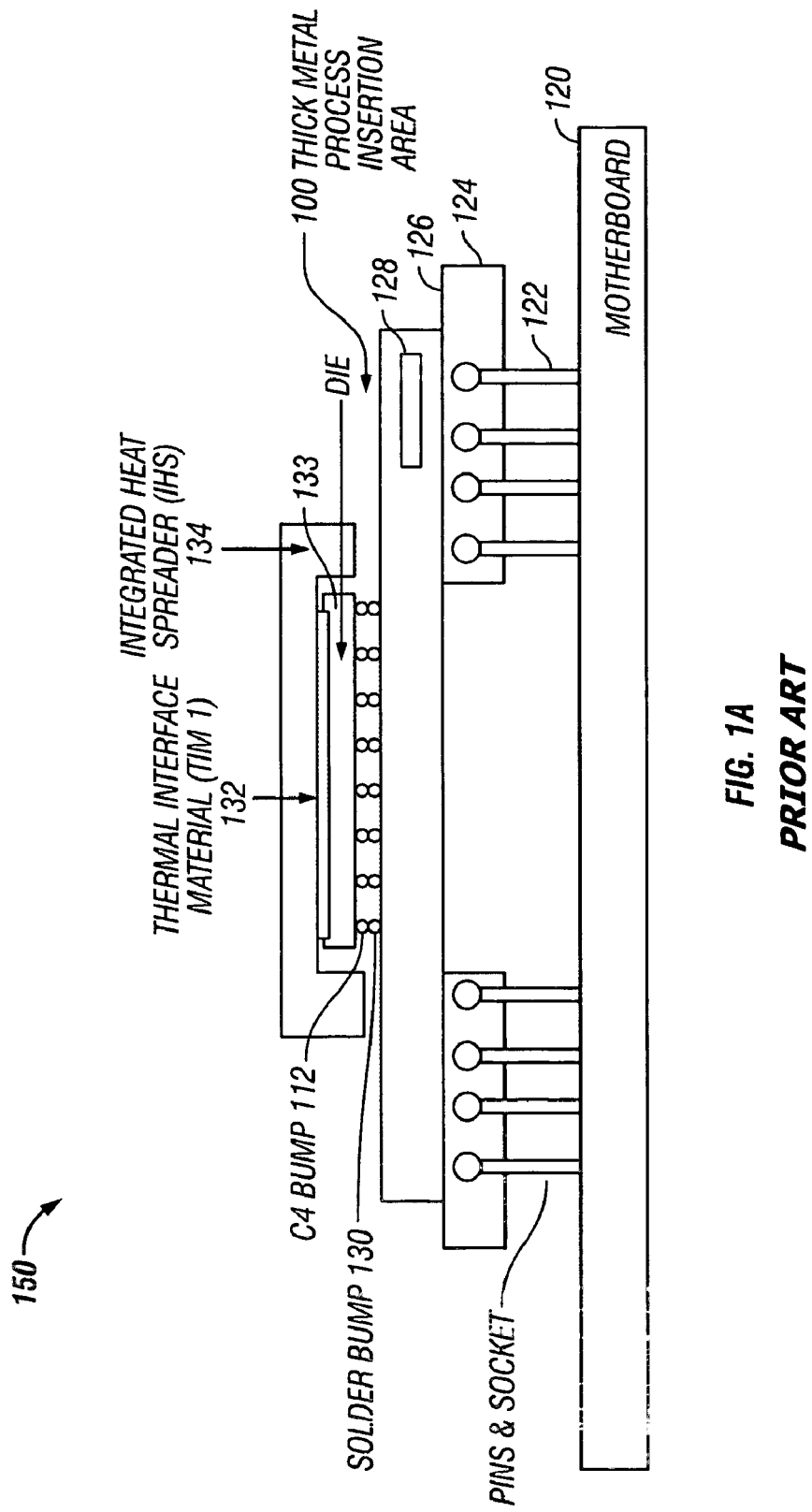
FIG. 1A illustrates a structure which may be part of a microprocessor or other device.

FIG. 1A illustrates a structure 150 which may be part of a microprocessor or some other device with integrated circuits. The structure 150 may include a motherboard 120, pins 122, socket connectors 124, sockets 126, a substrate 128, solder bumps 130, Controlled Collapse Chip Connection (C4) bumps 112, an interconnect structure 100, a die 133 (also called a wafer), a thermal interface material 132 and an integrated heat spreader 134. The motherboard 120 may supply electrical current (power) through the pins 122 to the substrate 128. The substrate 128 may supply current through the solder bumps 130 and C4 bumps 112 to the die 133. The C4 bumps 112 may be coupled to the solder bumps 130, which are attached to the substrate 128. The C4 bumps 112 may be made of copper, tin, a lead-tin (Pb—Sn) compound, etc.

Figure 1B:
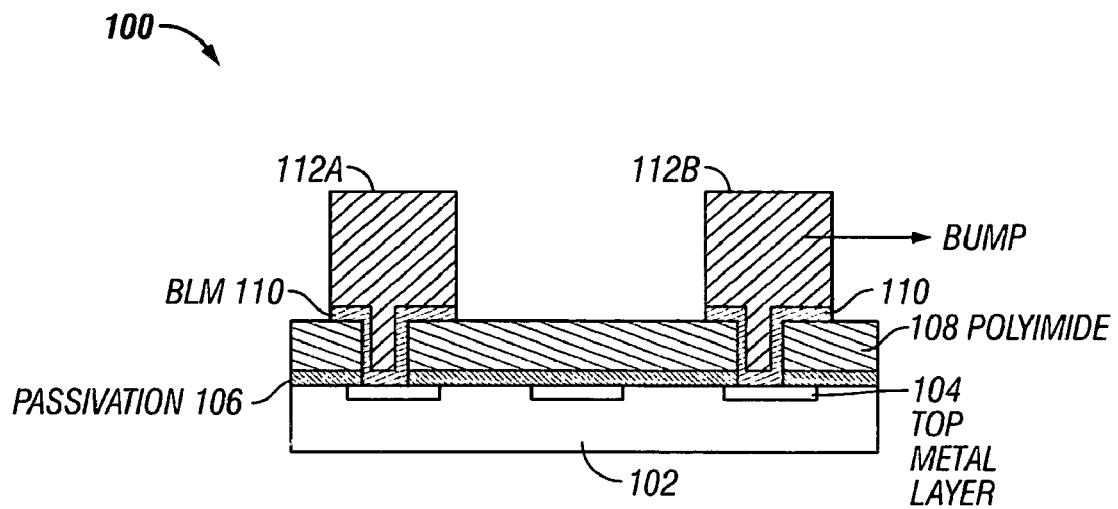
FIG. 1B illustrates a conventional interconnect structure and bumps of FIG. 1A.

FIG. 1B illustrates a conventional interconnect structure 100 of FIG. 1A. The interconnect structure 100 (FIG. 1B) may be on the die 133 (FIG. 1A) as part of a backend interconnect of a microprocessor. The interconnect structure 100 in FIGS. 1A and 1B may include a top metal layer 104, a passivation layer 106, a polyimide layer 108, a ball limited metallization (BLM) layer 110 and C4 bumps 112A–112B. "BLM" may also stand for base layer metallization. There may be several metal layers under the top metal layer 104, and there may be transistors under the metal layers.

The C4 bumps 112A–112B in FIGS. 1A and 1B may transfer current from the solder bumps 130 (FIG. 1A) to the top metal layer 104 (FIG. 1B). The top metal layer 104 may transfer current to the metal layers under the top metal layer 104, which transfer current to underlying transistors in the die 133. It may be desirable to limit or reduce a maximum current (Imax) through a specific C4 bump, such as the C4 bump 112B, to the top metal layer 104 to increase bump reliability.

A process flow is described to make a Controlled Collapse Chip Connection (C4) bump and interconnect structure with one or more integrated thick metal layers at a die or wafer level. The thick metal interconnect structure may be used in a backend interconnect of a microprocessor. The one or more integrated thick metal layers may improve power delivery and improve thermo-mechanical ability, i.e., reduce mechanical stress in low k ILD (inter-layer dielectric) and also at a die/package interface (solder bumps 130 and C4 bumps 112 in FIG. 1A).

In addition, higher resistance vias or higher resistance C4 bumps may be implemented in the thick metal interconnect structure 100 to provide better current spreading, i.e., improve uniform power distribution, and reduce maximum bump current (Imax).

FIGS. 2–8B illustrate various stages of making bumps 230 and an interconnect structure 800, which may be used in the structure 150 of FIG. 1A. FIGS. 9A and 9B show two example processes of making the structures of FIGS. 2–8B.

Figure 2:
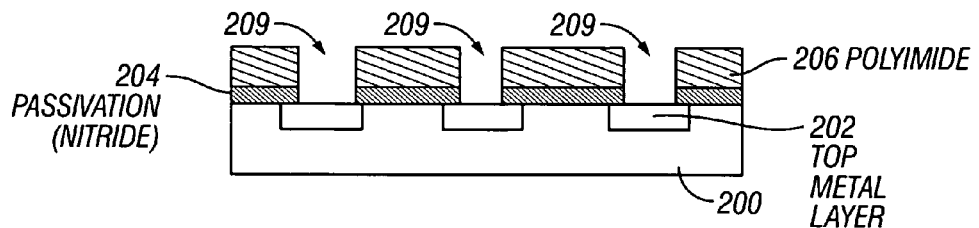
FIGS. 2–8B illustrate various stages of making an interconnect structure, which may be used in the structure of FIG. 1A.

In FIG. 2, the top metal layer 202 may be made of copper and may be about one micron thick in an embodiment. The top metal layer 202 may include an inter-layer dielectric (ILD). The ILD may be a conventional silicon dioxide or low K (dielectric constant less than 3, for example) material, such as carbon-doped oxide or low-K organic materials. A material with a low dielectric constant may be used to reduce signal delay times.

A passivation layer 204, such as a nitride, may be deposited over the top metal layer 202 at 900 (FIG. 9A). The passivation layer 204 may be around 2,400 angstroms thick. Portions of the passivation layer 204 over the metal layer 202 may be removed to form vias 209 after polyimide patterning is completed.

A polyimide layer 206 may be formed and patterned over the passivation layer 204 at 902 (FIG. 9A) and developed with vias 209 at 904. The polyimide layer 206 may comprise a polymer-type material and may be about 3 to 5 microns thick. Instead of polyimide, other materials such as epoxy or BCB (benzocyclobutene) may be used to form the layer 206.

Figure 3:
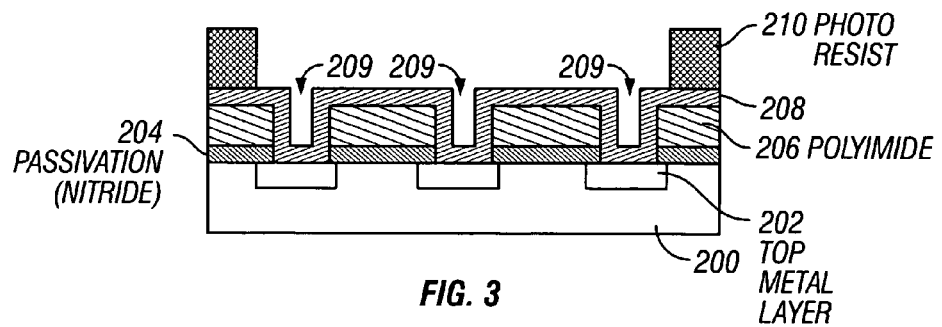

FIG. 3 illustrates the structure of FIG. 2 with a first ball limited metallization or base layer metallization (BLM) layer 208 deposited over the patterned and developed polyimide layer 206 at 906. The first BLM layer 208 may be deposited in and along sidewalls of the vias 209. The first BLM layer 208 may include a thin (e.g., 1000 Angstroms) titanium (Ti) layer, which may serve two functions: act as a diffusion barrier for a subsequent metal layer 212 (e.g., for copper) and provide adhesion for a metal seed layer (e.g., for copper). The first BLM layer 208 may further include a sputtered metal seed layer (e.g., 2000-Angstrom copper seed layer). The seed layer enables a subsequent metal layer 212 (e.g., copper) to be electroplated in FIG. 4. Materials for a BLM layer may vary with a choice of metal layer.

Figure 4:
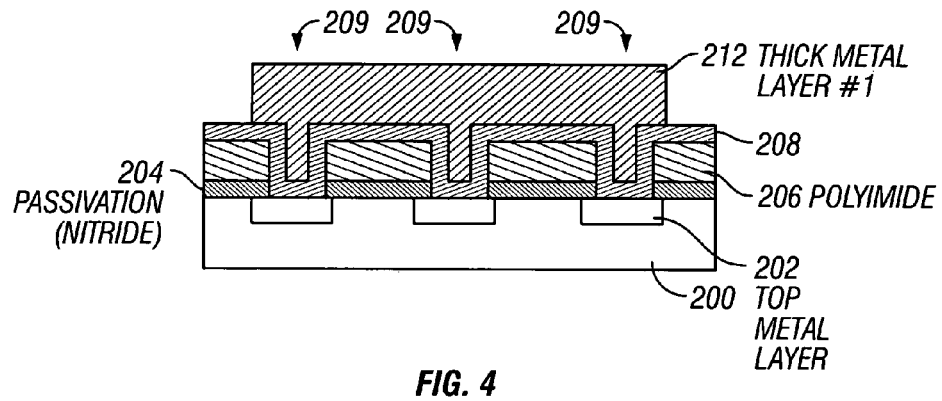

A photoresist layer 210 in FIG. 3 may be coated over the first BLM layer 208 at 908 and patterned at 910 for a first thick metal layer 212 in FIG. 4.

FIG. 4 illustrates the structure of FIG. 3 with a first thick metal layer 212 electroplated over the first BLM layer 208 at 912. The first thick metal layer 212 may be copper (Cu) and may have a pre-determined thickness, such as 1 to 100 microns ($\mu$m), preferably 10–50 $\mu$m. The first thick metal layer 212 may be deposited in the vias 209 over the first BLM layer 208. The photoresist 210 of FIG. 3 may be stripped at 914.

Figure 5:
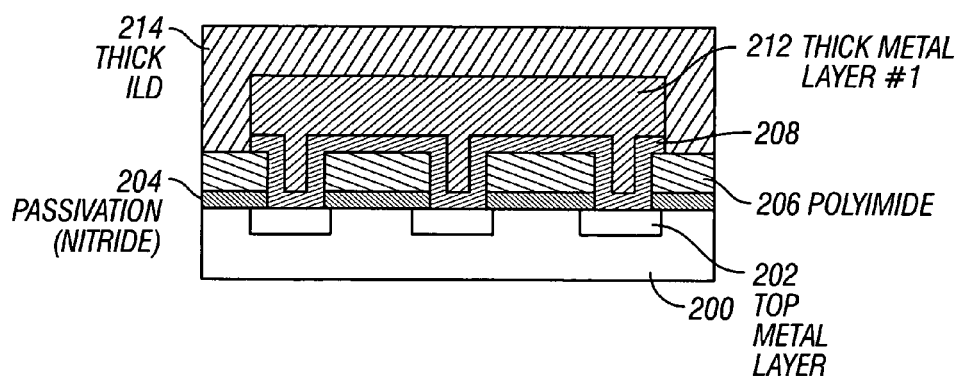

FIG. 5 illustrates the structure of FIG. 4 with the first BLM layer 208 etched back to a top of polyimide 206 at 916. "Ash" is a plasma process to remove photoresist. A first thick dielectric layer 214 may be deposited over the first thick metal layer 212 at 918A. A thickness of a thick dielectric layer may vary with a thickness of a thick metal layer. As an example, the first thick dielectric layer 214 may be about 60 microns thick if the first metal layer is 40–50 micron thick. The first thick dielectric layer 214 may be polyimide, epoxy, BCB (benzocyclobutene) or other spin-on polymer or spin-on glass or even silicon oxide. Also, the first dielectric layer 214 may be made of a self-planarizing, photo-definable polymer for flows in FIGS. 9A and 11A.

Figure 6:
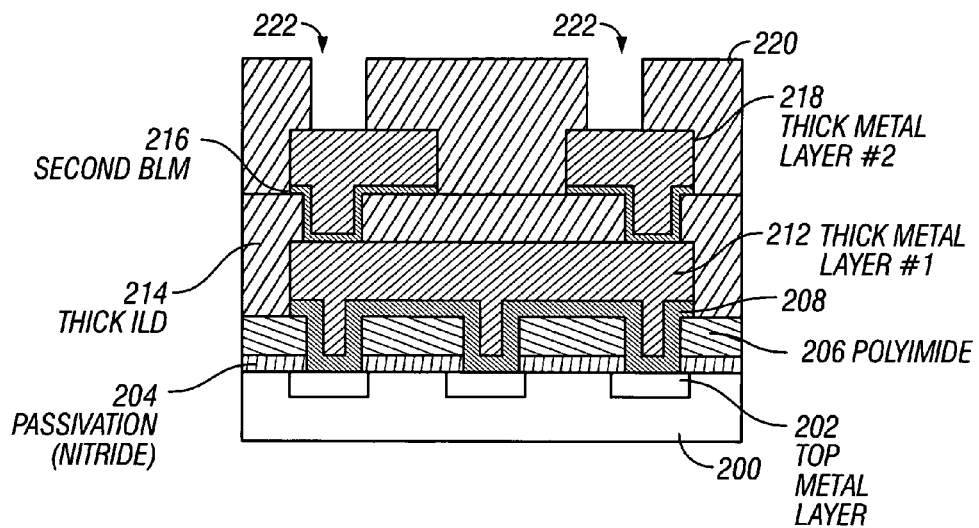

FIG. 6 illustrates the structure of FIG. 5 with the first dielectric layer 214 photo-patterned and developed for vias 222 at 920 and 922. The actions 906–922 in FIG. 9A described above may be repeated at 924–940 to form a second BLM layer 216, a second thick metal layer 218 and a second thick dielectric layer 220 with patterned vias 222.

The second thick metal layer 218 may be copper and may be 10 to 50 micrometers thick. The second thick metal layer 218 may be orthogonal to the first thick metal layer, as described below with reference to FIG. 8B. The first thick metal layer 212 in FIG. 6 may be in electrical contact with the second thick metal layer 218. As an example, the second thick dielectric layer 220 may be about 60 microns thick if the second thick metal layer is 40–50 microns thick. The second dielectric layer 220 may be polyimide, epoxy, BCB (benzocyclobutene) or other spin-on polymer or spin-on glass or even silicon oxide. Also, the second dielectric layer 220 may be made of a self-planarizing, photo-definable polymer for flows in FIGS. 9A and 11A.

Figure 7:
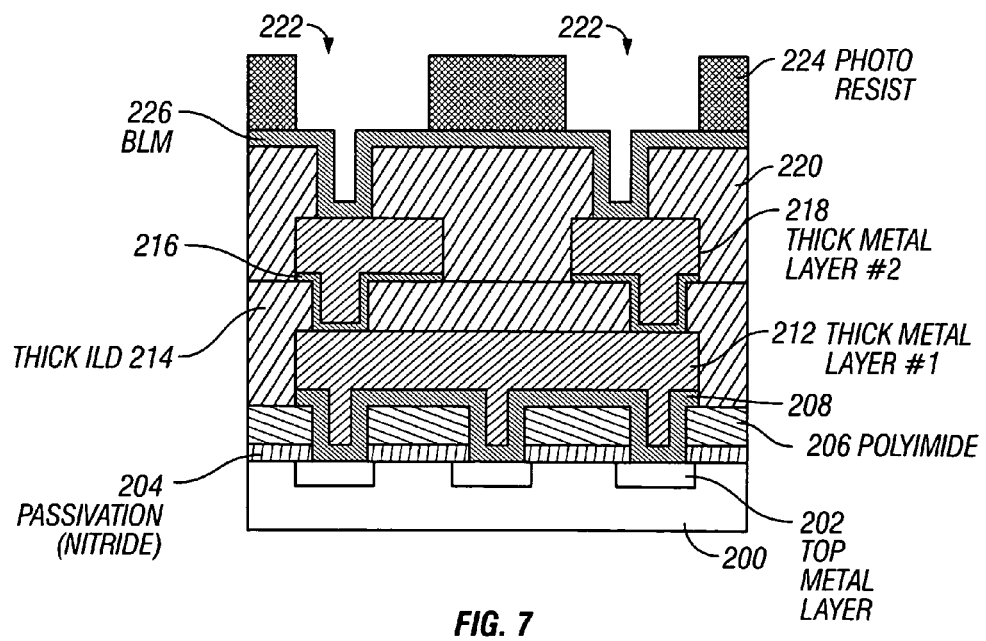

FIG. 7 illustrates the structure of FIG. 6 with a third BLM layer 226 deposited over the second dielectric layer 220 and in the vias 222 at 942. A photoresist 224 may be coated over the third BLM layer 226 at 944 and patterned for subsequently formed bumps 230A, 230B at 946.

Figure 8A:
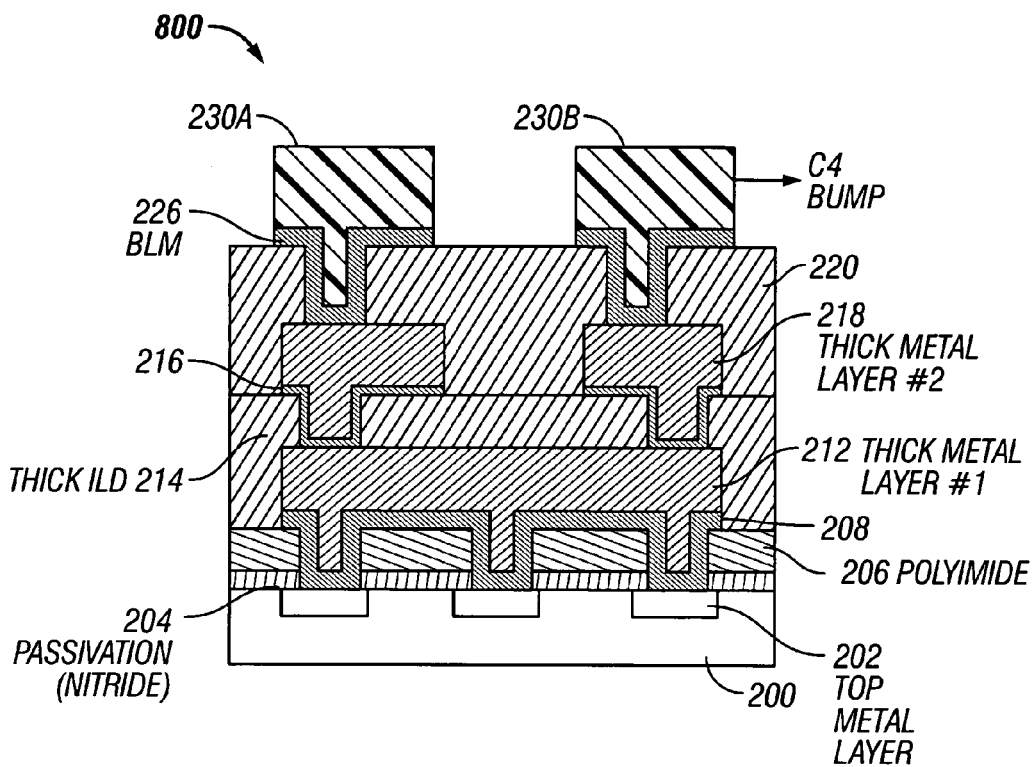
Figure 9A:
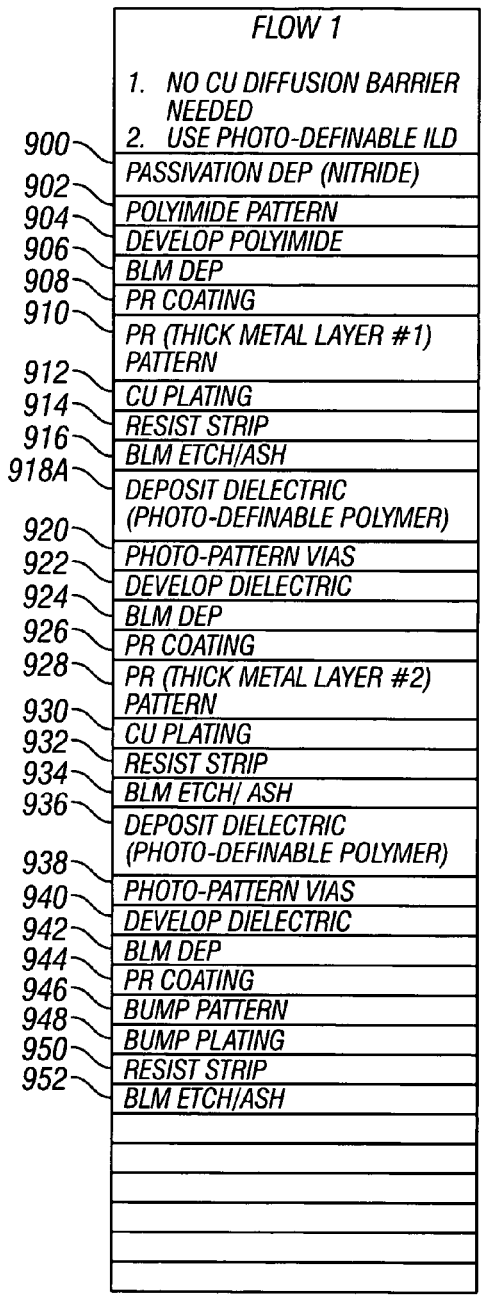
FIGS. 9A and 9B show two example processes of making the structures of FIGS. 2–8B.
Figure 9B:
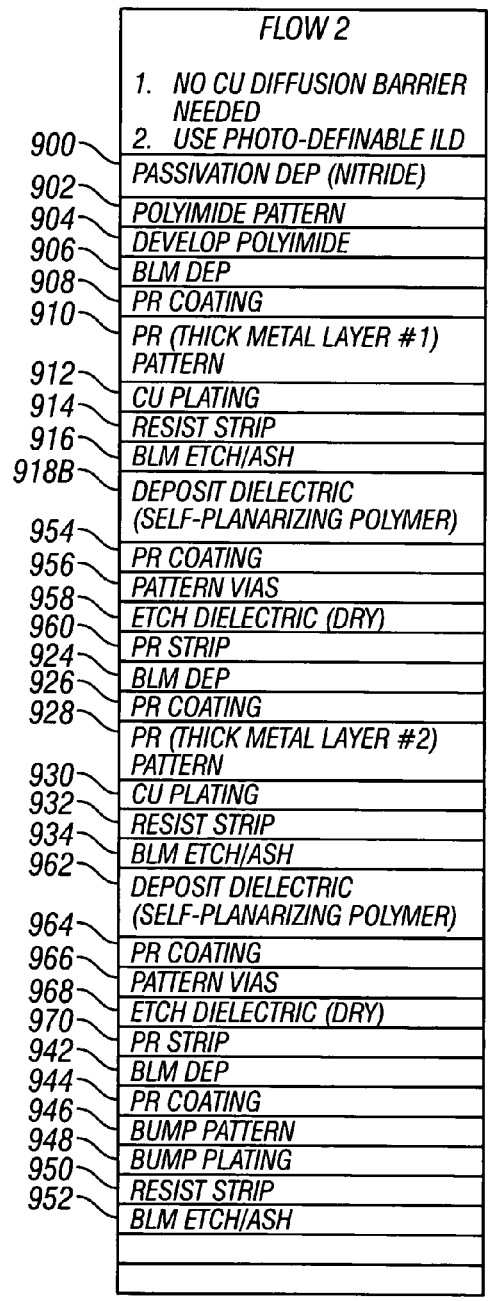

FIG. 8A illustrates the structure of FIG. 7 with a metal, such as copper or a lead-tin (Pb—Sn) compound, plated in the vias 222 of FIG. 7 to form bumps 230A–230B at 948. The plating may be electroplating. The photoresist 224 in FIG. 7 may be stripped at 950. The third BLM layer 226 may be etched back at 952 as shown in FIG. 8A.

If the bumps 230A–230B are made of a lead-tin (Pb—Sn) compound, the third BLM layer 226 may comprise a first titanium layer (e.g., 1000 Angstroms), an aluminum layer, (e.g., 10,000 Angstroms), a second titanium layer (e.g., 1000 Angstroms), and a nickel layer (e.g., 4000 Angstroms).

Figure 8B:
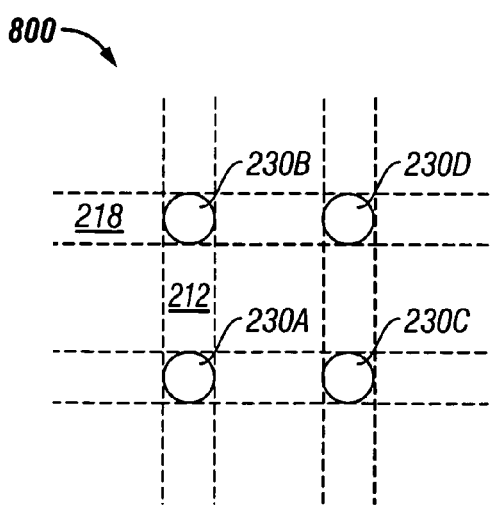

FIG. 8B illustrates a top view of the interconnect structure 800 of FIG. 8A. The second thick metal layer 218 in FIG. 8B may be orthogonal to the first thick metal layer 212. The second thick metal layer 218 may be in electrical contact with at least two bumps 230B, 230D.

Figure 1C:
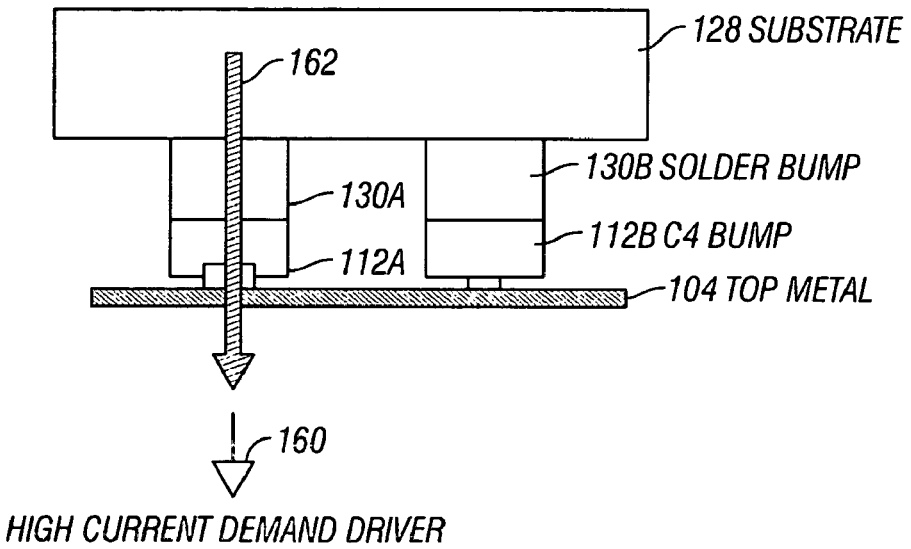
FIG. 1C illustrates a portion of the structure in FIG. 1A.

As shown in FIG. 1C, if a current driver (i.e., transistor) 160 demands a high current, current 162 has to come through one C4 bump 112A because the current 162 cannot be spread by more than one bump pitch.

Figure 1D:
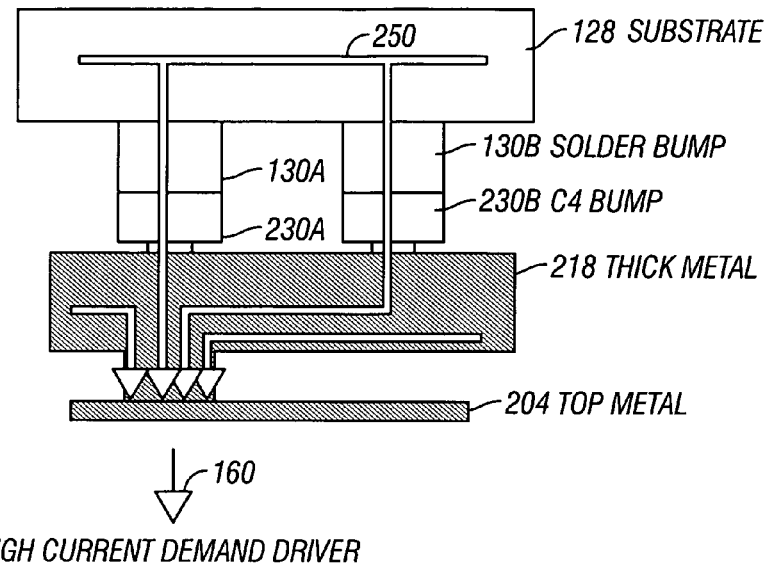
FIG. 1D shows a simplified version of the thick metal interconnect structure shown in FIG. 8A.

FIG. 1D shows a simplified version of the thick metal interconnect structure 800 shown in FIG. 8A. In FIG. 1D, current 250 can be spread by more than one bump pitch. Current 250 from the substrate 128 may be spread to multiple solder bumps 130A, 130B and then multiple C4 bumps 112A, 112B. The current 250 may then be spread through one or more thick metal layers 218 to the top metal layer 202, which is coupled to a high current demand driver 160. In this way, current 250 may come from multiple bumps 230A, 230B instead of one bump 112A (FIG. 1C), which can reduce current from one bump 230.

Bumps 230 which are farther away from the top metal layer 202 may contribute less current to the top metal layer 202. The closer the bump 230 is to the top metal layer 202, the more current that bump 230 may contribute.

FIG. 14 (described below) lists examples of maximum current values through the bumps 230A–230D. A maximum current through each bump 230A, 230B in FIGS. 8A and 8B may be lower than the maximum current through each bump 112A, 1122 in FIG. 1B because the bumps 230A, 230B in FIGS. 8A and 82 are coupled to thick metal layers 212, 218. The bumps 112A, 112B in FIG. 1B are not coupled to thick metal layers. Each bump 112 in FIG. 12 may have to carry a full desired current, such as 680 mA, to the top metal layer 104.

An alternative embodiment may have one thick metal layer instead of two thick metal layers 212, 218. A single thick metal layer may be coupled to a row of C4 bumps 230. There may be multiple thick metal layers in the same horizontal plane of the structure 800 in FIG. 8A, where each thick metal layer may be coupled to a row of C4 bumps 230.

FIG. 9B illustrates an alternative process of making the interconnect structure 800 of FIG. 8A. Actions 900–916 in FIG. 9B may be similar to actions 900–916 in FIG. 9A. At 918B in FIG. 9B, a non-photo-definable, self-planarizing polymer may be deposited as a first dielectric layer, e.g., an inter-layer dielectric (ILD), over the first thick metal layer 212 of FIG. 4. A photoresist layer may be coated over the dielectric layer at 954 in FIG. 9B. Vias may be patterned in the photoresist at 956. The first dielectric layer may be dry etched at 958. The photoresist may be stripped at 960.

Actions 924–934 in FIG. 9B may be similar to actions 924–934 in FIG. 9A. At 962 in FIG. 9B, a non-photo-definable, self-planarizing polymer may be deposited as a second dielectric layer, e.g., an inter-layer dielectric (ILD), over a second thick metal layer, which may be similar to the second thick metal layer 216 of FIG. 6. A photoresist layer may be coated over the second dielectric layer at 964. Vias may be patterned in the photoresist at 966. The second dielectric layer may be dry etched at 968. The photoresist may be stripped at 970. Actions 942–952 in FIG. 9B may be similar to actions 942–952 in FIG. 9A. The process of FIG. 9B may produce substantially the same structure 800 (FIG. 8A) as the process of FIG. 9A.

Figure 10:
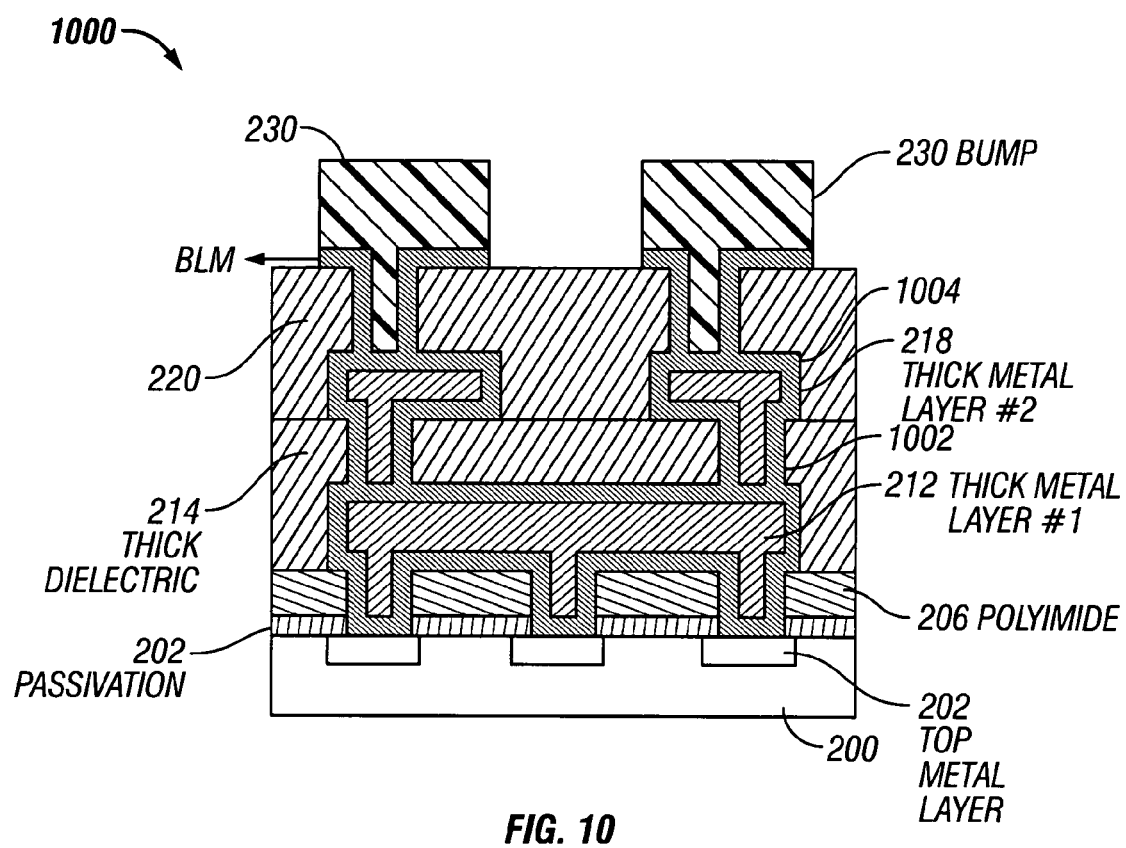
FIG. 10 illustrates an alternative embodiment of an interconnect structure, which is similar to the interconnect structure of FIG. 8A but with additional diffusion barriers.

FIG. 10 illustrates an alternative embodiment of a interconnect structure 1000, which is similar to the interconnect structure 800 of FIG. 8A but with additional diffusion barriers 1002, 1004. The diffusion barriers 1002, 1004 are intended to prevent the metal layers 212, 218 (e.g., copper) from diffusing into the dielectric layers 214, 220. The diffusion barriers 1002, 1004 may be formed by electroless (EL) cobalt plating over and on the sides of the metal layers 212, 218, which is described below with reference to FIGS. 11A, 11B and 12.

FIG. 11A shows an example of a process flow to make the interconnect structure 1000 of FIG. 10. Actions 900–952 in FIG. 11A may be similar to actions 900–952 in FIG. 9A. Diffusion barriers 1002, 1004 (FIG. 10) may be electroless (EL) plated at 1100 and 1102 in FIG. 11A.

FIG. 11B shows an alternative process flow to make the interconnect structure 1000 of FIG. 10. Actions 900–952 in FIG. 11B may be similar to actions 900–952 in FIG. 9B. Diffusion barriers 1002, 1004 (FIG. 10) may be electroless (EL) plated at 1100 and 1102 in FIG. 11B.

Figure 12:
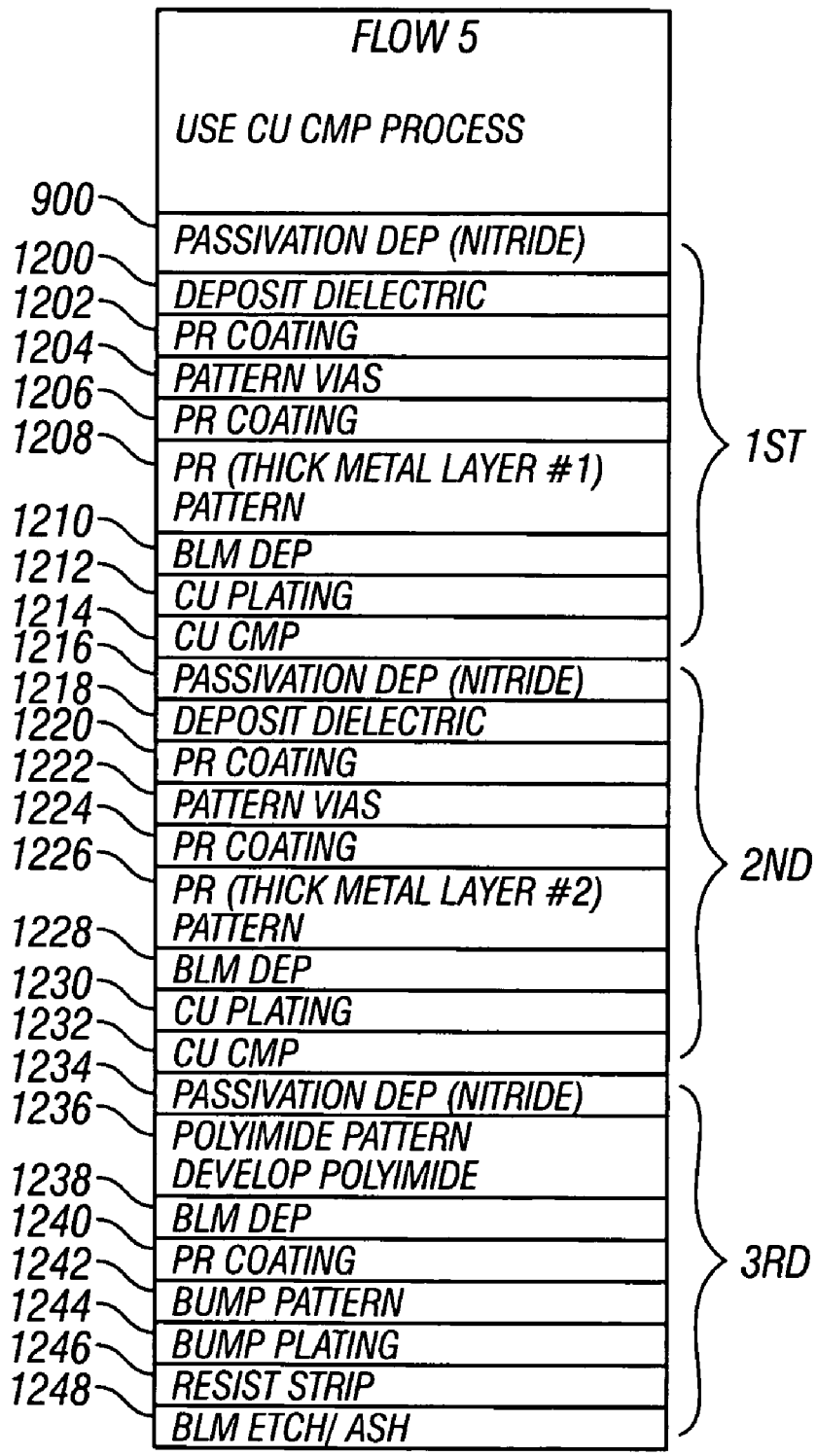
FIG. 12 shows a process flow to make an interconnect structure shown in FIG. 13F.
Figure 13A:
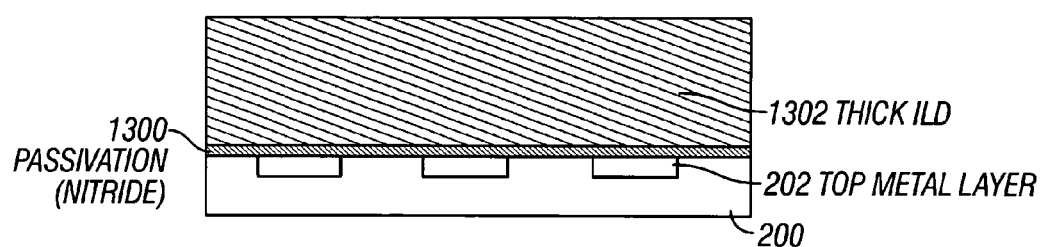
FIGS. 13A–13F illustrate stages of an interconnect structure according to the process flow of FIG. 12.
Figure 13B:
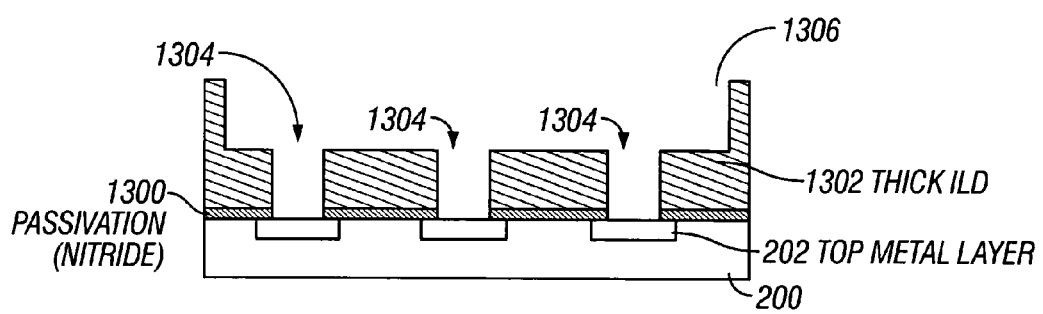
Figure 13C:
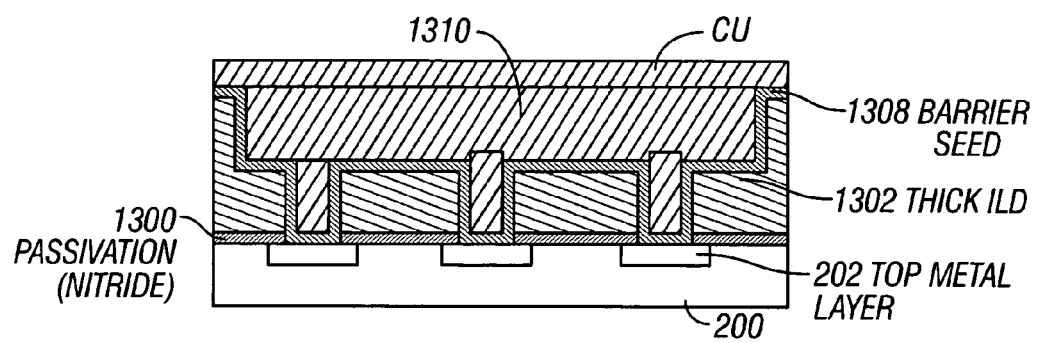
Figure 13D:
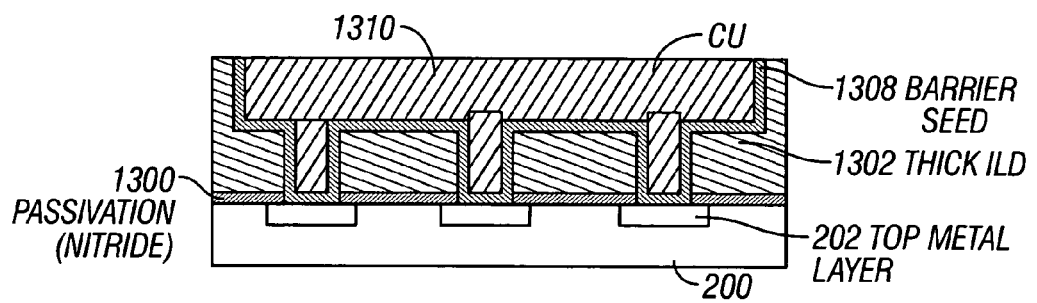
Figure 13E:
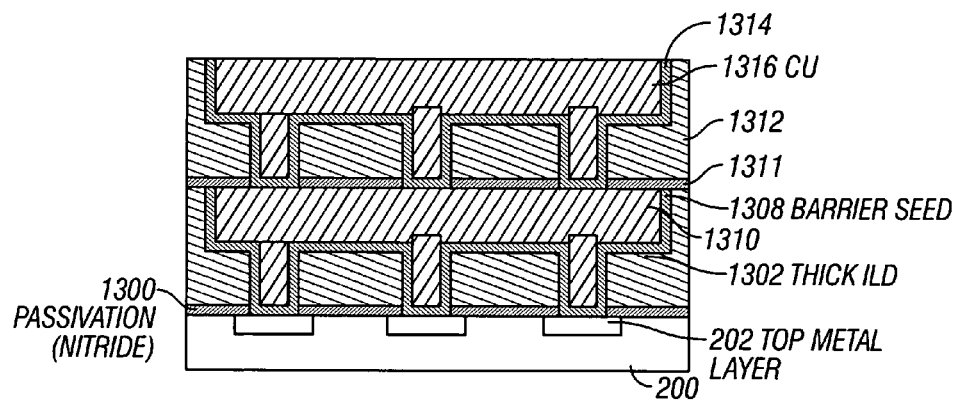
Figure 13F:
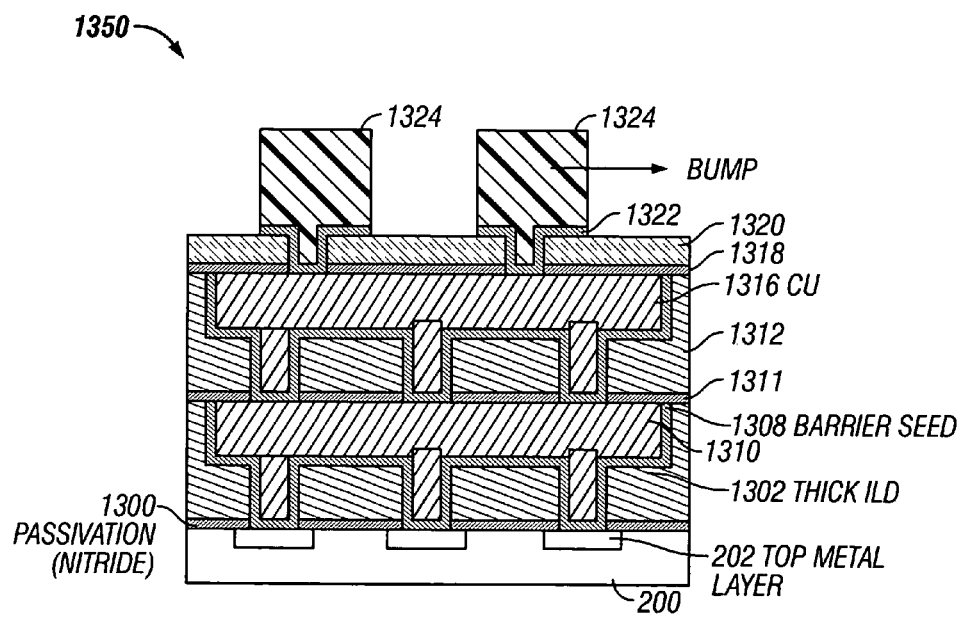

FIG. 12 shows a process flow to make an interconnect structure 1350 shown in FIG. 13F. FIGS. 13A–13F illustrate stages of the interconnect structure 1350 according to the process flow of FIG. 12. The interconnect structure 1350 of FIG. 13F may have copper diffusion barriers like the diffusion barriers 1002, 1004 of the interconnect structure 1000 of FIG. 10.

A first passivation layer 1300, e.g., nitride, in FIG. 13A may be deposited on a top metal layer 202 at 900 in FIG. 12. A first thick dielectric 1302, e.g., an ILD, may be deposited over the first passivation layer 1300 at 1200 in FIG. 12. The thickness of the first thick dielectric layer depends on thick metal layer thickness. As an example, the first thick dielectric layer 1302 may be about 60 microns thick.

Single or dual damascene process may be used depending on the thick metal thickness. FIG. 13B shows a dual damascene process. A first photoresist may be coated over the first thick dielectric 1302 at 1202. Vias 1304 may be patterned in the first thick dielectric 1302 in FIG. 13B at 1204. The first photoresist may then be removed. A second photoresist may be coated over the first thick dielectric 1302 at 1206. The second photoresist may pattern trenches 1306 (FIG. 13B) at 1208. The second photoresist may then be removed.

A first BLM layer 1308 (i.e., barrier seed layer) in FIG. 13C may be deposited in the vias 1304 and trenches 1306 at 1210. A first thick metal layer 1310 (e.g., copper) may be plated over the first BLM layer 1308 in vias 1304 and trenches 1306 at 1212.

The first thick metal layer 1310 may be polished in FIG. 13D at 1214 by, for example, chemical mechanical polishing (CMP).

Actions 1216–1232 of FIG. 12 may be similar to the actions 900–1214 of FIG. 12 described above. Actions 1216–1232 may form a second passivation layer 1311, e.g., nitride, a second dielectric layer 1312, a second BLM layer 1314 and a second thick metal layer 1316 in FIG. 13E.

A third passivation layer 1318, e.g., nitride, may be formed over the second thick metal layer 1316 in FIG. 13F at 1234. A polyimide layer 1320 may be patterned and developed over the third passivation layer 1318 at 1236. A third BLM layer 1322 may be deposited over the polyimide layer 1320 at 1238. Another photoresist may be coated over the third BLM layer 1322 at 1240. Bumps 1324 may be patterned and plated in spaces left by the photoresist at 1242 and 1244.

The photoresist around the bumps 1324 may be stripped at 1246. Then the third BLM layer 1322 may be etched at 1248.

FIG. 14 is a table of simulation parameters and simulation results for the interconnect structure 800 of FIG. 8A (with two thick metal layers 212, 218) compared to maximum current and voltage drop for the standard interconnect structure 100 of FIG. 1B. The standard interconnect structure 100 of FIG. 1, with no thick metal layers, is represented by row 1310 in FIG. 14. The standard interconnect structure 100 of FIG. 1 may have, for example, a maximum current (Imax) through the bump 112 of 680 mA, and a voltage drop (V=IR) from the bump 112 to the top metal layer 104 of 29 mV.

The simulation parameters in FIG. 14 include (a) thickness and (b) width of the two thick metal layers 212, 218 in FIGS. 8A and 10, and (c) resistance of the vias 222 (FIGS. 7–8A) between the bumps 230 and the second thick metal layer 218. Four sets 1400–1406 of parameters and results are shown in FIG. 14. The four sets 1400–1406 may have lower Imax current per bump than the standard interconnect structure 100 (represented by row 1410 in FIG. 14) because current needed by drivers (i.e., transistors under the top metal layer 202) may be obtained from multiple bumps 230 and the two thick metal layers 212, 218 (FIG. 8A). Thus, the thick metal layers 212, 218 may reduce Imax and improve power delivery.

The third set 1404 has a higher via resistance (70 mOhms) than the first set 1400. The third set 1404 has a lower Imax (370 mA) and a higher voltage drop (49 mV) than the first set 1400.

More uniform distribution of current through multiple adjacent bumps 230 may reduce a maximum current per bump (Imax) by 46%. With a thick metal layer integrated flow, Imax may be improved by about 22 to 35%, depending on metal thickness. Thicker metal may provide better Imax. Increasing resistance of the via 222 (FIG. 8A) may improve Imax by 46%.

To increase via resistance, the vias 222 of FIG. 8A between the bump 230 and the second thick metal layer 218 may be made smaller. Resistance increases if area decreases. Alternatively or additionally, the second BLM layer thickness may be increased. Also, the vias 222 or bump itself may be deposited with materials that have a higher resistance than copper (Cu), such as tungsten (W).

Figure 15A:
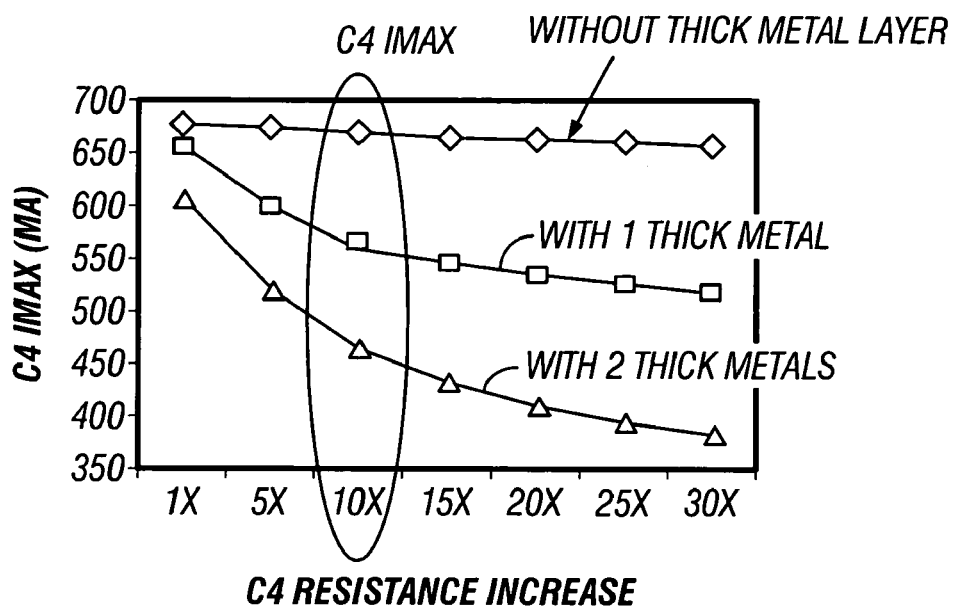
FIG. 15A illustrates a relationship between C4 via resistance and C4 maximum current for the structures of FIG. 1B and FIG. 8A.

FIG. 15A illustrates a relationship between C4 via resistance and C4 maximum current (Imax) for the structures of FIGS. 1B and FIG. 8A. As C4 via resistance increases, C4 maximum current (Imax) decreases.

Figure 15B:
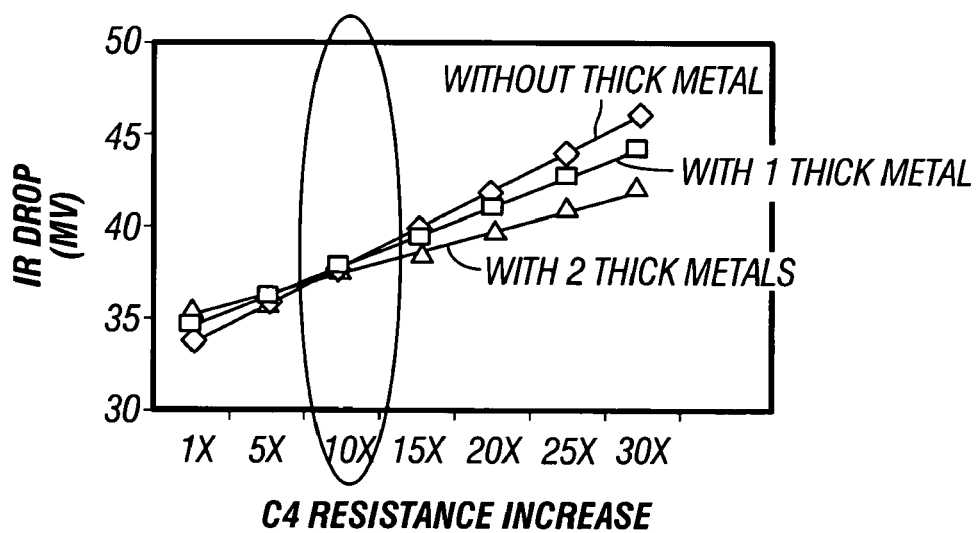
FIG. 15B illustrates a relationship between C4 resistance and voltage drop in millivolts for the structures of FIGS. 1B and FIG. 8A.

FIG. 15B illustrates a relationship between C4 resistance and voltage drop (V=IR in millivolts) for the structures of FIG. 1B and FIG. 8A. As C4 resistance increases, V=IR for the via increases.

As stated above, the one or more integrated thick metal layers (e.g., 212, 218 in FIG. 8A) may improve thermomechanical ability, i.e., reduce mechanical stress in low k ILD and also at a die/package interface, e.g., solder bumps 130 and C4 bumps 112 in FIG. 1A.

Figure 16:
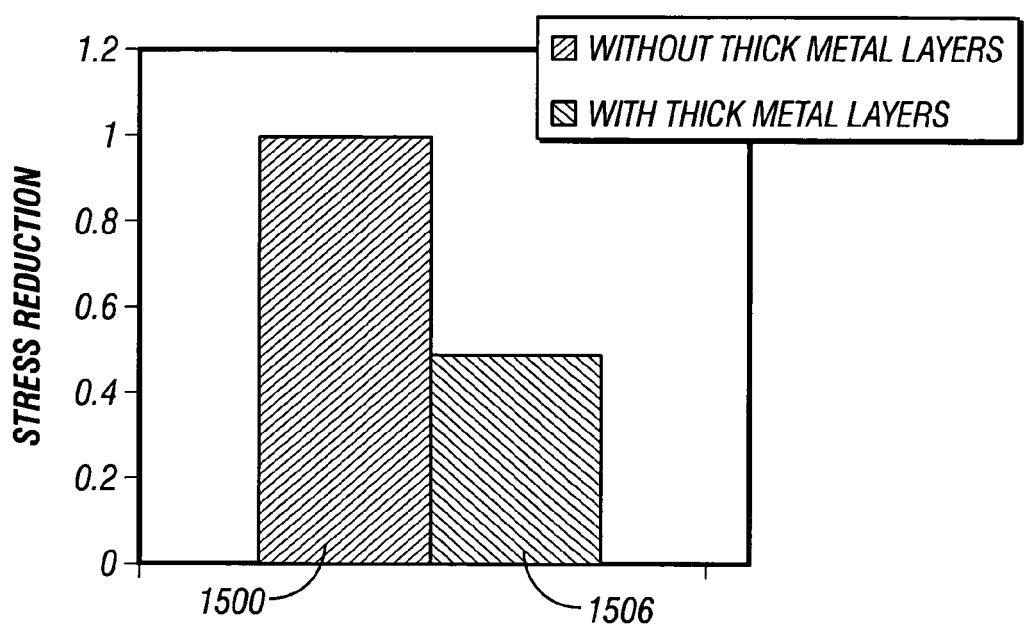
FIG. 16 compares stress reduction of the standard interconnect structure of FIG. 1B with the structure of FIG. 8A, which has two thick metal layers.

FIG. 16 compares stress impact on low k (dielectric constant) ILD layer (a) with the standard interconnect structure 100 of FIG. 1B and (b) with the proposed structure 800 of FIG. 8A, which has two thick metal layers 212, 218. For example, the bump structure 800 of FIG. 8A with two 45-micrometer thick metal layers 212, 218 may have 50% less stress on low k layer such as carbon-doped oxide (CDO) than the standard interconnect structure 100 of FIG. 1B.

A number of embodiments have been described. Nevertheless, it will be understood that various modifications may be made without departing from the spirit and scope of the application. Accordingly, other embodiments are within the scope of the following claims.

What is claimed is:

1. An apparatus comprising:
    first and second Controlled Collapse Chip Connection bumps;
    a unitary first metal layer coupled to the first and second bumps, the first metal layer being formed in a trench of a dielectric layer, the first metal layer being coupled to a top metal layer of an integrated circuit die, the first metal layer being adapted to transfer current from the first and second bumps to the top metal layer of the integrated circuit die; and
    a unitary second metal layer over the first metal layer, the second metal layer being coupled to the first bump, a third bump and the first metal layer, the second metal layer being adapted to transfer current from the first and third bumps to the first metal layer.

2. The apparatus of claim 1, wherein the third bump is a Controlled Collapse Chip Connection bump.

3. The apparatus of claim 1, wherein the first and second bumps are coupled to first and second solder bumps of a substrate.

4. The apparatus of claim 1, wherein the first metal layer is about 10 to 50 microns thick.

5. The apparatus of claim 1, wherein the first metal layer comprises electroplated copper.

6. The apparatus of claim 1, wherein the first metal layer is deposited in vias over a first base layer metallization, which is deposited over the top metal layer of the integrated circuit die.

7. The apparatus of claim 1, further comprising a first dielectric layer enclosing the first metal layer.

8. The apparatus of claim 7, wherein the first dielectric layer comprises a self-planarizing, photo-definable polymer.

9. The apparatus of claim 7, wherein the first dielectric layer comprises a self-planarizing, non-photo-definable polymer.

10. The apparatus of claim 1, wherein the second metal layer is orthogonal to the first metal layer.

11. The apparatus of claim 1, further comprising a unitary diffusion barrier over and on sides of the first metal layer.

12. The apparatus of claim 3, wherein current from the substrate is spread to both of the first and second solder bumps and then to both of the first and second Controlled Collapse Chip Connection bumps.

13. An apparatus comprising:
    first and second connection means;
    a unitary first metal layer coupled to the first and second connection means, the first metal layer being formed in a trench of a dielectric layer, the first metal layer being coupled to a top metal layer of an integrated circuit die, the first metal layer being adapted to transfer current from the first and second connection means to the top metal layer of the integrated circuit die; and
    a unitary second metal layer over the first metal layer, the second metal layer being coupled to the first connection means, a third connection means and the first metal layer, the second metal layer being adapted to transfer current from the first and third connection means to the first metal layer.

14. The apparatus of claim 13, wherein the first, second, and third connection means are Controlled Collapse Chip Connection bumps.

15. The apparatus of claim 13, wherein the first and second connection means are coupled to first and second solder bumps of a substrate.

16. The apparatus of claim 13, wherein the first metal layer is deposited in vias over a first base layer metallization, which is deposited over the top metal layer of the integrated circuit die.

17. The apparatus of claim 13, further comprising dielectric layering means enclosing the first metal layer.

18. The apparatus of claim 17, wherein the first dielectric layer means comprises self-planarizing, photo-definable polymer.

19. The apparatus of claim 17, wherein the first dielectric layer means comprises self-planarizing, non-photo-definable polymer.

20. The apparatus of claim 17, wherein the second metal layer is orthogonal to the first metal layer.

21. The apparatus of claim 17, wherein the first dielectric layer means comprises self-planarizing, photo-definable polymer.

22. The apparatus of claim 17, wherein the first dielectric layer means comprises self-planarizing, non-photo-definable polymer.

23. The apparatus of claim 17, further comprising diffusion barrier means over and on sides of the first layer means.

24. An apparatus comprising:
    first and second connection means;
    first unitary layer means coupled to the first and second connection means, the first layer means being formed in a trench of a dielectric layer, the first layer means being coupled to a top metal layer of an integrated circuit die, the first layer means being adapted to transfer current from the first and second connection means to the top metal layer of the integrated circuit die; and
    second unitary layer means over and orthogonal to the first layer means, the second layer means layer being coupled to the first connection means, a third connection means and the first layer means, the second layer means being adapted to transfer current from the first and third connection means to the first layer means.

25. The apparatus of claim 24, wherein the first, second, and third connection means are Controlled Collapse Chip Connection bumps.

26. The apparatus of claim 24, wherein the first and second connection means are coupled to first and second solder bumps of a substrate.

27. The apparatus of claim 24, wherein the first layer means is deposited in vias over a first base layer metallization, which is deposited over the top metal layer of the integrated circuit die.

28. The apparatus of claim 24, further comprising dielectric layering means enclosing the first metal layer.

* * * * *